United States Patent
Koga et al.

(10) Patent No.: US 11,233,341 B2
(45) Date of Patent: Jan. 25, 2022

(54) FITTING-EQUIPPED CONDUCTIVE SHEET

(71) Applicants: AUTONETWORKS TECHNOLOGIES, LTD., Yokkaichi (JP); SUMITOMO WIRING SYSTEMS, LTD., Yokkaichi (JP); SUMITOMO ELECTRIC INDUSTRIES, LTD., Osaka (JP)

(72) Inventors: Nobunori Koga, Yokkaichi (JP); Hitoshi Horio, Yokkaichi (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 17/041,549

(22) PCT Filed: Mar. 27, 2019

(86) PCT No.: PCT/JP2019/013408
§ 371 (c)(1),
(2) Date: Sep. 25, 2020

(87) PCT Pub. No.: WO2019/202936
PCT Pub. Date: Oct. 24, 2019

(65) Prior Publication Data
US 2021/0119352 A1    Apr. 22, 2021

(30) Foreign Application Priority Data

Apr. 16, 2018 (JP) .............................. JP2018-078716

(51) Int. Cl.
*H01R 4/16* (2006.01)
*H01R 4/58* (2006.01)
(Continued)

(52) U.S. Cl.
CPC ............... *H01R 4/16* (2013.01); *H01R 4/188* (2013.01); *H01R 4/58* (2013.01);
(Continued)

(58) Field of Classification Search
CPC ...... H01R 4/16; H01R 13/65912; H01R 4/58; H01R 4/18; H01R 4/188; H01R 4/203
See application file for complete search history.

(56) References Cited

U.S. PATENT DOCUMENTS

| 8,274,019 B2 * | 9/2012 | Morin ...................... H05B 3/56 219/482 |
| 9,490,551 B2 | 11/2016 | Hirooka et al. |
| 2016/0190712 A1 | 6/2016 | Hirooka et al. |

FOREIGN PATENT DOCUMENTS

| JP | S55-168979 U | 12/1980 |
| JP | H08-227786 A | 9/1996 |

OTHER PUBLICATIONS

May 28, 2019 International Search Report issued in International Patent Application No. PCT/JP2019/013408.

* cited by examiner

*Primary Examiner* — Renee S Luebke
*Assistant Examiner* — Paul D Baillargeon
(74) *Attorney, Agent, or Firm* — Oliff PLC

(57) ABSTRACT

A fitting-equipped conductive sheet including: a conductive sheet material in which a plurality of conductive strands are aligned planarly; and a plate-shaped conductive fitting attached to ends of the plurality of conductive strands, wherein the conductive fitting includes a folded-back portion, and a first sandwiching portion and a second sandwiching portion that are folded back with the folded-back portion as a starting point and the first sandwiching portion and the second sandwiching portion are opposed to each other.

7 Claims, 10 Drawing Sheets

(51) Int. Cl.
*H01R 4/18* (2006.01)
*H01R 13/6591* (2011.01)
(52) U.S. Cl.
CPC ......... *H01R 13/65912* (2020.08); *H01R 4/18* (2013.01); *H01R 4/182* (2013.01)

FITTING-EQUIPPED CONDUCTIVE SHEET

BACKGROUND

The present disclosure relates to a fitting-equipped conductive sheet in which a conductive fitting is attached to a conductive sheet material.

In automobiles or the like, a wire through which a large current passes, a high-voltage wire, or the like becomes a noise source, and is therefore covered by a shielding member, thus taking measures to prevent noise from diffusing to the outside. For example, the fitting-equipped conductive sheet described in JP 2015-57758A includes a conductive sheet material, and a connection fitting electrically connected to the sheet material. The sheet material is formed of a metal cloth having a mesh structure formed by metal yarns that have been woven so as to intersect each other, and the connection fitting is formed by a pair of plate-shaped sandwiching portions that sandwich an end (edge) of the sheet material, and a folded-back portion that connects the pair of plate-shaped sandwiching portions.

The connection fitting of the fitting-equipped conductive sheet is attached to a casing of a control device or the like, and the sheet material of the fitting-equipped conductive sheet is used for covering a wire disposed outside the casing. In order to reduce the connection resistance and achieve a large fixing strength, a portion that is firmly crimped to the sheet material is formed at at least one of the plate-shaped sandwiching portions of the connection fitting.

SUMMARY

In the fitting-equipped conductive sheet of JP 2015-57758A, an end of the metal cloth having a mesh structure is sandwiched by the pair of plate-shaped sandwiching portions of the connection fitting. More specifically, the sheet material is formed by longitudinal metal yarns arranged along a direction in which the sheet material connects connection fittings to each other, and lateral metal yarns arranged orthogonal to the longitudinal metal yarns. Also, the longitudinal metal yarns and the lateral metal yarns are sandwiched between the pair of plate-shaped sandwiching portions.

The lateral metal yarns are provided mainly for retaining the shape of the fitting-equipped conductive sheet. There is a problem in that, when the lateral metal yarns are sandwiched by the pair of plate-shaped sandwiching portions, the lateral metal yarns are likely to be displaced longitudinally from the sandwiched position. Therefore, it can be considered that sandwiching only the longitudinal metal yarns by the pair of plate-shaped sandwiching portions can reduce the occurrence of variation in the sandwiched state achieved by the pair of plate-shaped sandwiching portions.

However, the following problem arises in the case of sandwiching only the longitudinal metal yarns by the pair of plate-shaped sandwiching portions. That is, if the sheet material is wetted when the fitting-equipped conductive sheet is disposed under a wetting environment, water is likely to travel along the longitudinal metal yarns to enter a portion where the sheet material and the connection fitting are electrically connected to each other, inside the connection fitting. Note that if there are lateral metal yarns, it is considered that the lateral metal yarns serve the function of preventing entry of water in the electrical connection portion.

Therefore, there is a need for a further improvement in order to obtain a fitting-equipped conductive sheet that can reduce the occurrence of variation in the sandwiched state of the sheet material, and prevent entry of water in the portion where the sheet material and the connection fitting are electrically connected to each other.

An exemplary aspect of the disclosure provides a fitting-equipped conductive sheet that can reduce the occurrence of variation in the state in which the conductive sheet material is sandwiched by a conductive fitting, and prevent entry of water in a bent apex portion serving as a portion where the conductive sheet material and the conductive fitting are electrically connected to each other.

An aspect of the present disclosure lies in a fitting-equipped conductive sheet including: a conductive sheet material in which a plurality of conductive strands are aligned planarly; and a plate-shaped conductive fitting attached to ends of the plurality of conductive strands, wherein the conductive fitting includes a folded-back portion, and a first sandwiching portion and a second sandwiching portion that are folded back with the folded-back portion as a starting point and the first sandwiching portion and the second sandwiching portion are opposed to each other, a bent apex resulting from the first sandwiching portion having been bent toward the second sandwiching portion is formed on an inner surface of the first sandwiching portion so as to be parallel to a parting line of the folded-back portion, the ends of the plurality of conductive strands are electrically connected to the conductive fitting by being brought into pressure contact with the bent apex and sandwiched between the bent apex and the second sandwiching portion so as to intersect the bent apex, and a projection having a smaller radius of curvature than the bent apex portion is formed on an inner surface of the first sandwiching portion or the second sandwiching portion at a position located on the conductive sheet material side relative to the bent apex so as to be in contact with the ends of the plurality of the conductive strands.

In the fitting-equipped conductive sheet according to the above-described aspect, the bent apex is formed on the inner surface of the first sandwiching portion of the conductive fitting, and the conductive sheet material is electrically connected to the conductive fitting by the bent apex. The bent apex is formed as a result of the first sandwiching portion having been bent, and the electrical connection between the conductive sheet material and the conductive fitting can be ensured by the bent apex.

The ends of the plurality of conductive strands of the conductive sheet material are brought into pressure contact with the bent apex. Also, the ends of the plurality of conductive strands are sandwiched between the bent apex of the first sandwiching portion and the second sandwiching portion so as to intersect the bent apex. That is, between the bent apex and the second sandwiching portion, the ends of the plurality of conductive strands that intersect the bent apex are present, and no conductive strand that is substantially parallel to the direction in which the bent apex is formed is present. Accordingly, it is possible to reduce the occurrence of variation in the state in which the ends of the plurality of conductive strands of the conductive sheet material are sandwiched by the conductive fitting.

No conductive strand that is substantially parallel to the direction in which the bent apex is formed is present between the bent apex and the second sandwiching portion. Accordingly, if the fitting-equipped conductive sheet is wetted, water may enter the bent apex for ensuring electrical connection between the conductive sheet material and the conductive fitting. To deal with this problem, in the fitting-equipped conductive sheet according to the above-described aspect, the projection is formed on the inner surface of the first sandwiching portion or the second sandwiching portion at a position located on the conductive sheet material side relative to the bent apex.

The projection is formed to have a smaller radius of curvature than the bent apex, and is in contact with the ends of the plurality of conductive strands. Accordingly, water traveling along the plurality of conductive strands of the conductive sheet material to enter the bent apex can be blocked by the projection.

With the fitting-equipped conductive sheet according to the above-described aspect, it is possible to reduce the occurrence of variation in the state in which the conductive sheet material is sandwiched by the conductive fitting, and prevent entry of water in the bent apex serving as a portion where the conductive sheet material and the conductive fitting are electrically connected to each other.

DETAILED DESCRIPTION OF EMBODIMENTS

A preferred embodiment of the above-described fitting-equipped conductive sheet will be described with reference to the drawings.

Figure 1:
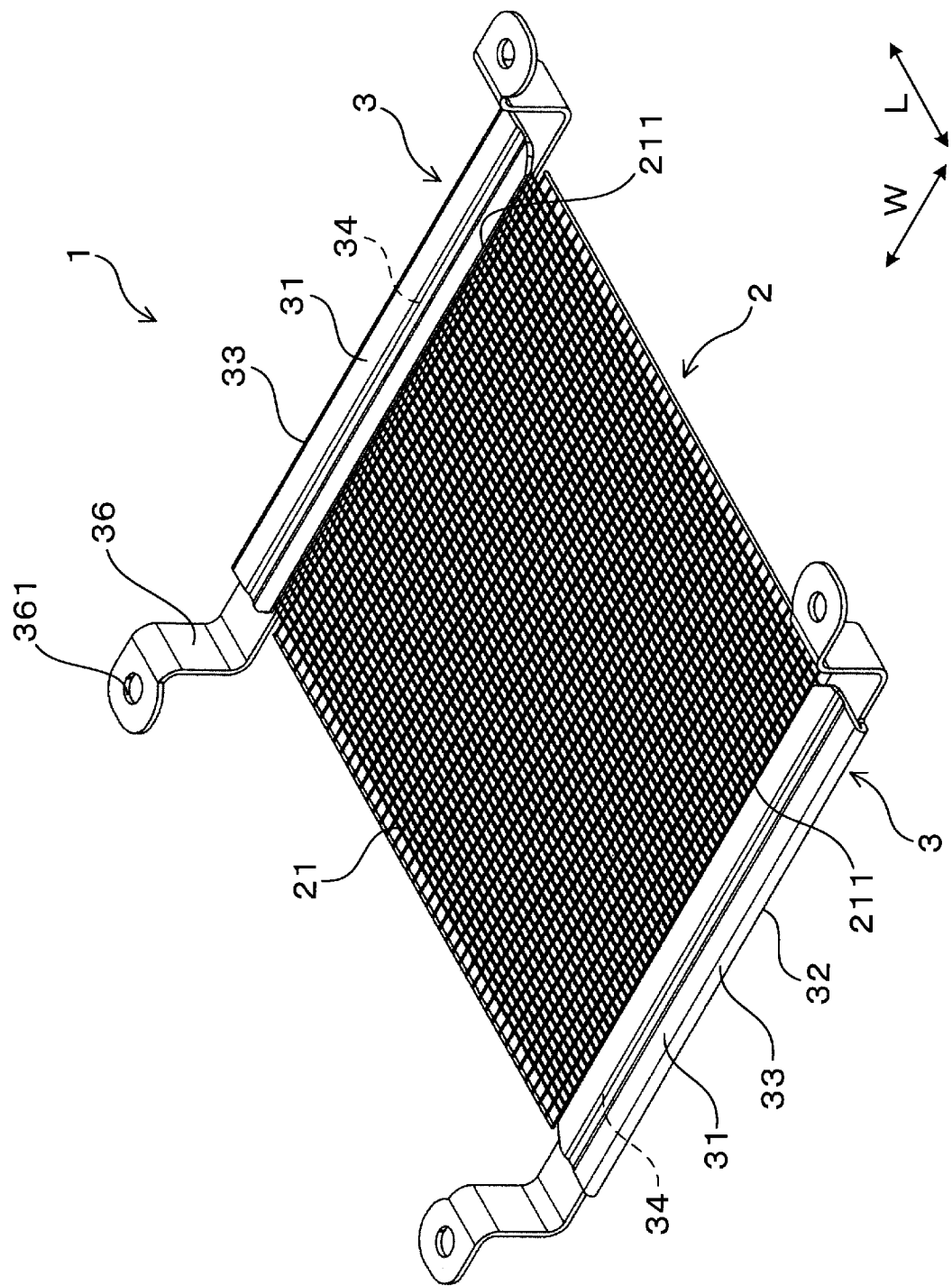
FIG. 1 is a perspective view showing a fitting-equipped conductive sheet according to an embodiment.

As shown in FIG. 1, a fitting-equipped conductive sheet 1 according to the present embodiment includes a conductive sheet material 2 in which a plurality of conductive strands 21 are aligned planarly, and plate-shaped conductive fittings 3 attached to ends 211 of the plurality of conductive strands 21. Each conductive fitting 3 includes a folded-back portion 33, and a first sandwiching portion 31 and a second sandwiching portion 32 that are folded back with the folded-back portion 33 as a starting point and are opposed to each other.

Figure 2:
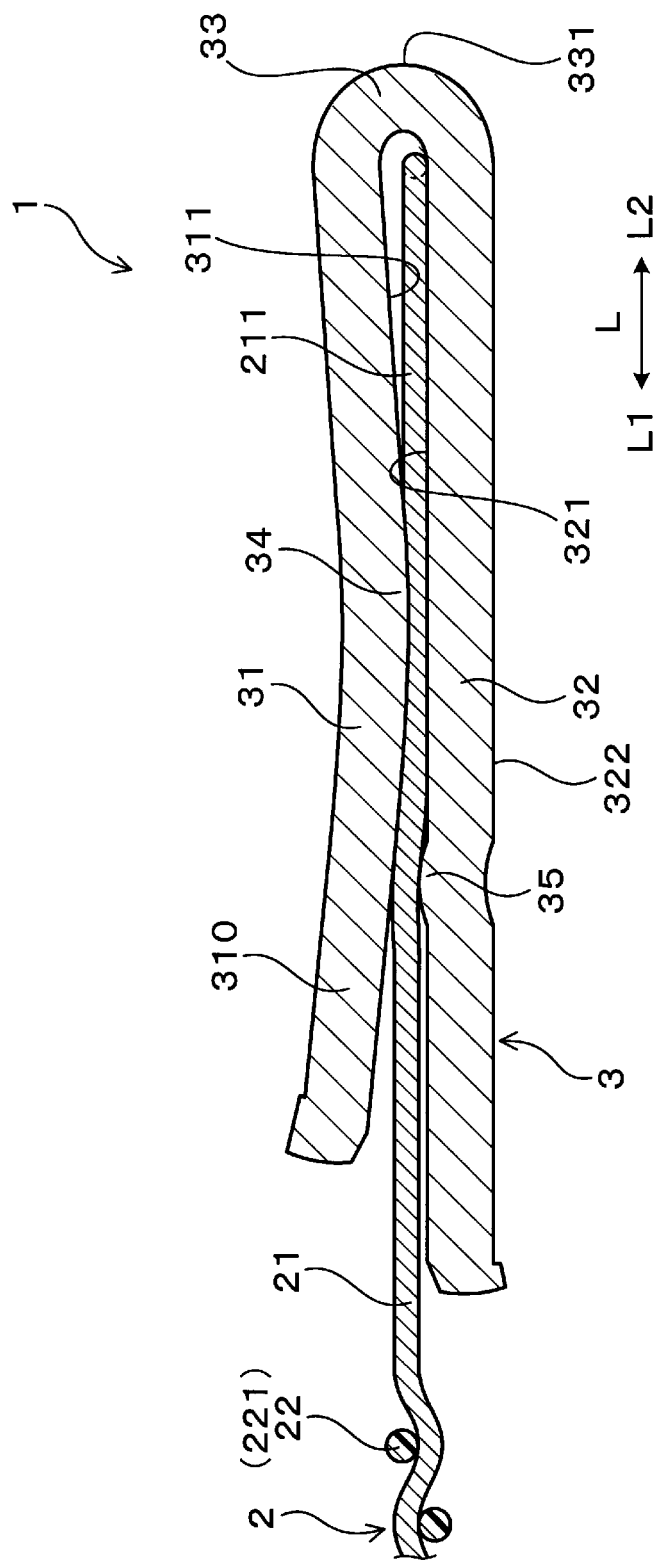
FIG. 2 is a cross-sectional view showing the periphery of a conductive fitting of the fitting-equipped conductive sheet according to the embodiment.

As shown in FIGS. 1 and 2, a bent apex portion 34 (bent apex) resulting from the first sandwiching portion 31 having been bent toward the second sandwiching portion 32 is formed on an inner surface 311 of the first sandwiching portion 31 so as to be parallel to a parting line 331 of the folded-back portion 33. The ends 211 of the plurality of conductive strands 21 are electrically connected to the conductive fitting 3 by being brought into pressure contact with the bent apex portion 34 and sandwiched between the bent apex portion 34 and the second sandwiching portion 32 so as to intersect the bent apex portion 34. A projection 35 having a radius of curvature R2 smaller than a radius of curvature R1 of the bent apex portion 34 is formed on an inner surface 321 of the second sandwiching portion 32 at a position located on the conductive sheet material 2 side relative to the bent apex portion 34 so as to be in contact with the ends 211 of the plurality of the conductive strands 21.

In the following, the fitting-equipped conductive sheet 1 according to the present embodiment will be described.

Fitting-Equipped Conductive Sheet 1

Figure 3:
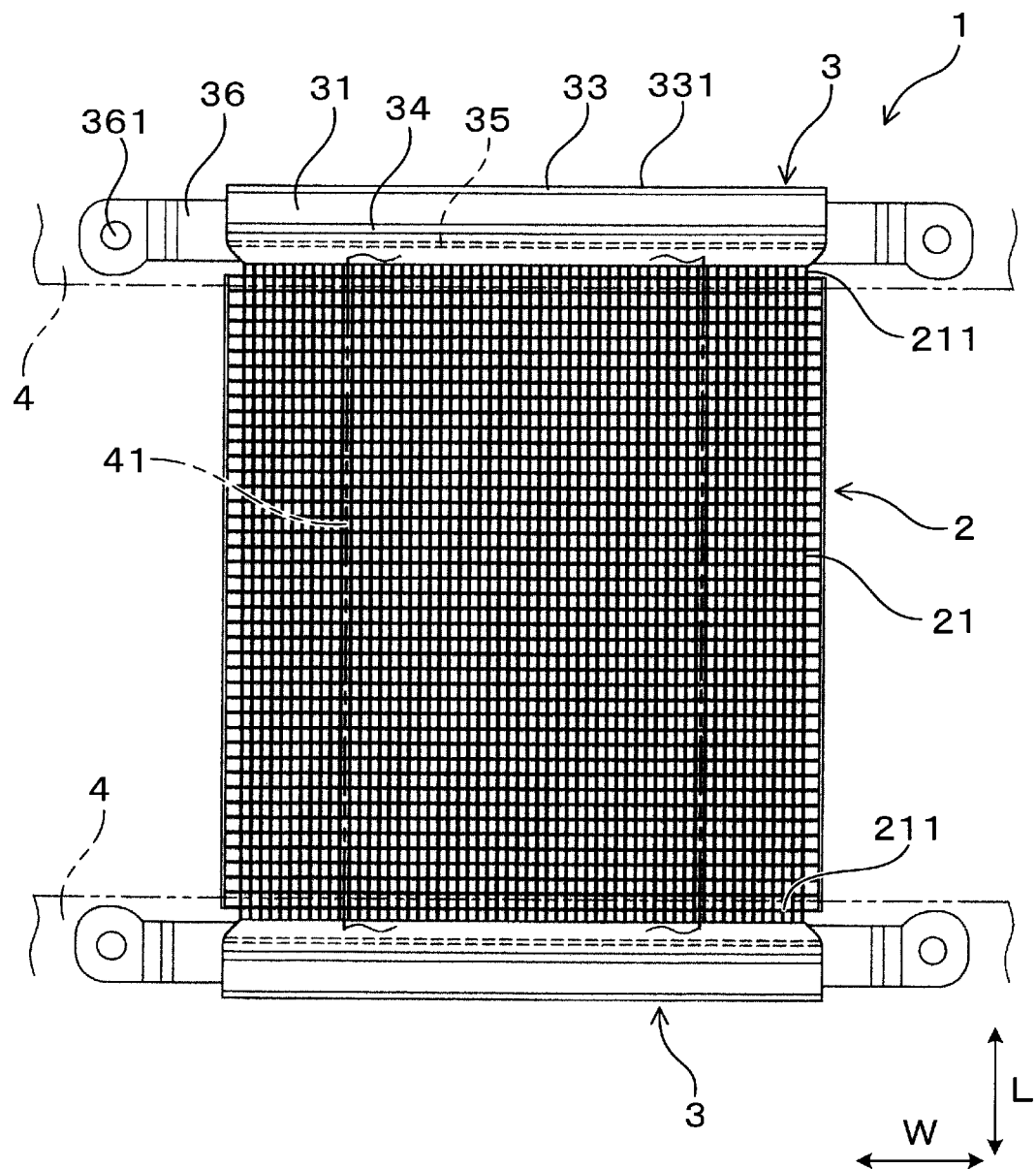
FIG. 3 is a plan view showing the fitting-equipped conductive sheet according to the embodiment.

As shown in FIG. 3, the fitting-equipped conductive sheet 1 is connected to a casing 4 or the like of a control device at a ground potential, and is used as a shielding member (shielding wire) for reducing electromagnetic noise. The fitting-equipped conductive sheet 1 according to the present embodiment covers an electromagnetic noise source 41 with the conductive sheet material 2, and is used for preventing electromagnetic noise from being diffused from the electromagnetic noise source 41 to the surroundings. Note that the fitting-equipped conductive sheet 1 may cover a specific wire, device, or the like with the conductive sheet material 2, and be used for protecting the specific wire, device, or the like from electromagnetic noise diffused from the surroundings.

The fitting-equipped conductive sheet 1 can be used such that the conductive sheet material 2 is disposed in the shape of a flat plate so as to cover the electromagnetic noise source 41 from one side. Alternatively, the fitting-equipped conductive sheet 1 can also be used such that the conductive sheet material 2 is disposed in the shape of a tube so as to cover around the electromagnetic noise source 41. Note that the conductive sheet material 2 can also be disposed in a similar shape in the case of protecting a specific wire, device, or the like from electromagnetic noise.

The fitting-equipped conductive sheet 1 includes conductive fittings 3 at opposite ends 211 of the conductive sheet material 2. Also, the fitting-equipped conductive sheet 1 allows a current to flow from one of the conductive fittings 3 to the other conductive fitting 3 via the conductive sheet material 2.

As shown in FIGS. 1 to 3, in the fitting-equipped conductive sheet 1, a conductive direction in which a current flows between the pair of conductive fittings 3 via the conductive sheet material 2 is referred to as a longitudinal direction L. A direction that is orthogonal to the longitudinal direction L and defines a plane of the conductive sheet material 2 together with the longitudinal direction L is referred to as a lateral direction W. The side, in the longitudinal direction L, on which the conductive sheet material 2 is located between the pair of conductive fittings 3 is referred to as an inner side L1, and the side, in the longitudinal direction L, on which the conductive fitting 3 is located is referred to as an outer side L2.

Conductive Sheet Material 2

Figure 4:
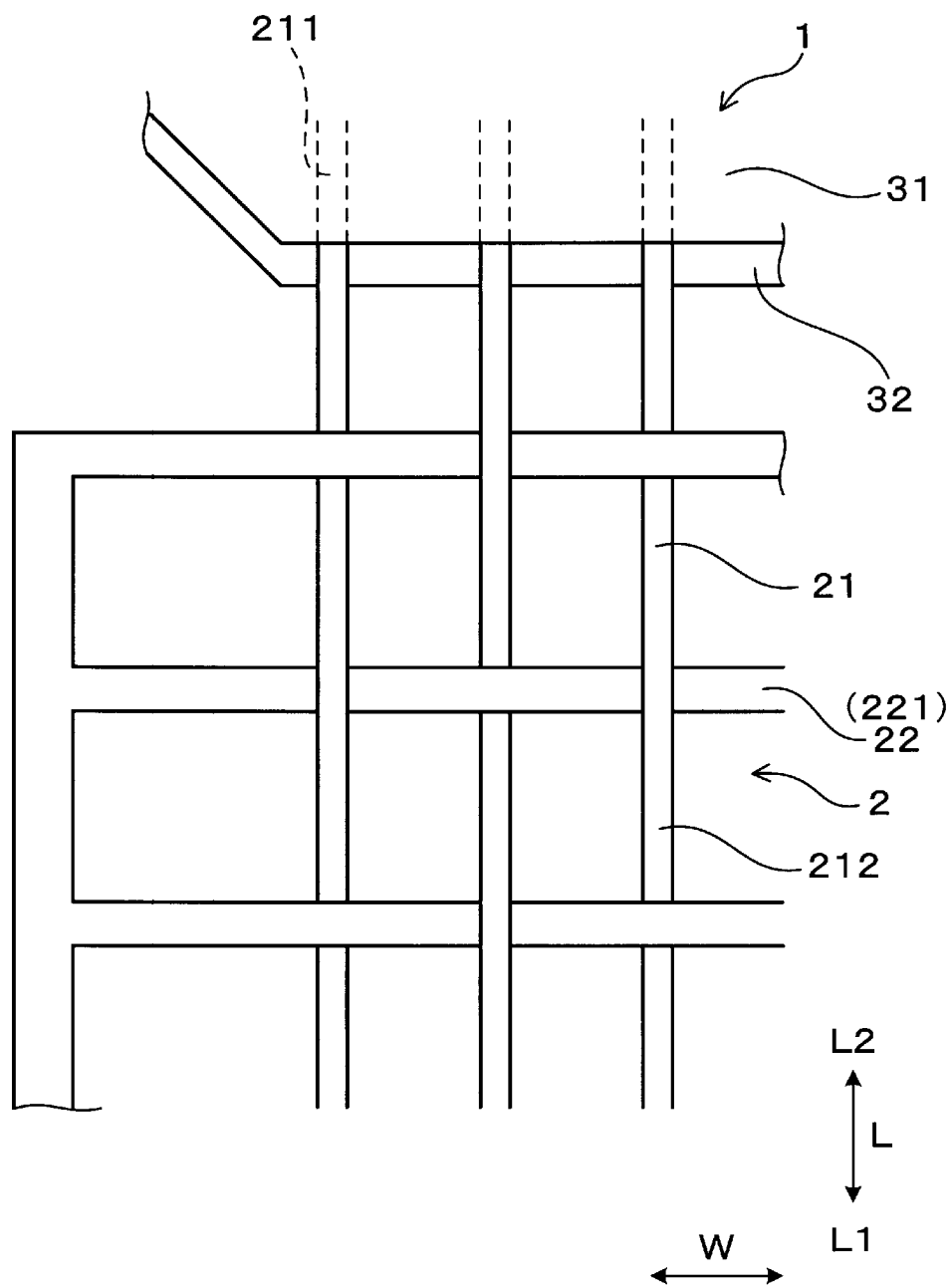
FIG. 4 is an enlarged cross-sectional view showing a part of a conductive sheet material of the fitting-equipped conductive sheet according to the embodiment.

As shown in FIGS. 3 and 4, the plurality of conductive strands 21 of the conductive sheet material 2 according to the present embodiment are aligned along the longitudinal direction L with predetermined intervals in the lateral direction W. The bent apex portion 34 is formed along the lateral direction W, and the plurality of conductive strands 21 are aligned along a direction perpendicular to the direction in which the bent apex portion 34 is formed. Note that the plurality of conductive strands 21 can also be arranged so as to be inclined relative to the direction in which the bent apex portion 34 is formed.

The bent apex portion 34 may be formed so as to be slightly inclined to a parting line 331 of the folded-back portion 33. The parting line 331 refers to a line formed by the folding-back starting point on the outer side of the folded-back portion 33. The parting line 331 of the present embodiment is formed along the lateral direction W.

Each end 211 of a conductive strand 21 of the present embodiment is connected to an end 211 of the conductive strand 21 adjacent thereto. The plurality of conductive strands 21 are connected so as to meander to the inner side L1 and the outer side L2 in the longitudinal direction L. Note that the plurality of conductive strands 21 need not be connected to each other.

Each conductive strand 21 is formed of a metal yarn serving as a conductive metal yarn. The conductive strand 21 is formed to have a wire diameter (thickness) with flexibility. The conductive strand 21 can be formed of a copper material, an aluminum material, a steel wire, or the like.

Intermediate portions 212 of the plurality of conductive strands 21 other than the ends 211 are maintained in a state in which a predetermined interval is maintained therebetween by an insulating reinforcing material 22. The reinforcing material 22 is formed of a resin material. The reinforcing material 22 includes linear portions 221 that intersect the plurality of conductive strands 21. The plurality of conductive strands 21 are braided by the linear portions 221 of the reinforcing material 22.

In FIG. 4, the arrangement state of the reinforcing material 22 is schematically shown. The arrangement relationship between the plurality of conductive strands 21 and the plurality of linear portions 221 on one side and the other side in a thickness direction that is orthogonal to the longitudinal direction L and the lateral direction W is alternately switched so as to form a mesh state (grid state). In other words, the plurality of linear portions 221 that intersect the conductive strands 21 are arranged alternately on one side and the other side in the thickness direction relative to the conductive strands 21. Also, the plurality of conductive strands 21 that intersect the linear portions 221 are arranged alternately on the one side and the other side in the thickness direction relative to the linear portions 221.

The entire reinforcing material 22 can be formed of a linear (yarn-like) resin material. The reinforcing material 22 may also include linear portions that are arranged so as to be nearly parallel to the conductive strands 21. Also, when the linear reinforcing materials 22 are braided with the plurality of conductive strands 21, the linear reinforcing materials 22 may also be braided with each other.

With the reinforcing material 22, it is possible to maintain the planar arrangement state of the plurality of conductive strands 21, thus increasing the rigidity of the plurality of conductive strands 21 (conductive sheet material 2). By using the linear reinforcing material 22, it is also possible to reduce the amount of the resin material used. The reinforcing material 22 may have various configurations for maintaining the planar arrangement state of the plurality of conductive strands 21.

Although not shown, the conductive strands 21 that form the conductive sheet material 2 may include, in addition to the plurality of conductive strands 21 arranged along the longitudinal direction L, a plurality of conductive strands arranged along the lateral direction W at the intermediate portions 212 of the conductive strands 21 extending in the longitudinal direction L. In this case, the planar arrangement state of the plurality of conductive strands 21 can be maintained by the plurality of conductive strands arranged along the lateral direction W. Also, in this case, the plurality of conductive strands extending in the lateral direction W are not arranged at opposite ends 211 of the plurality of conductive strands 21 extending in the longitudinal direction L.

Conductive Fitting 3

Figure 5:
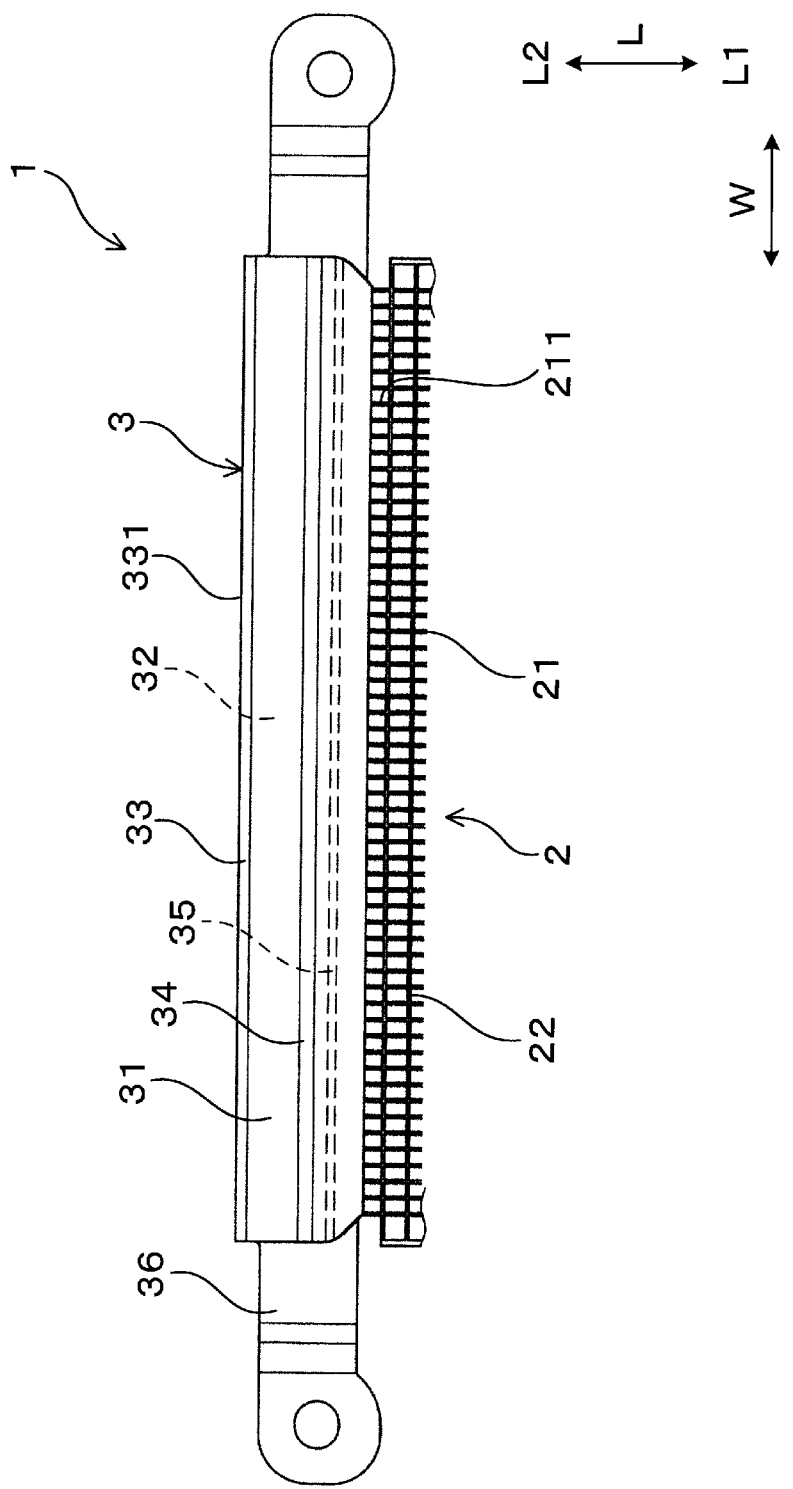
FIG. 5 is a plan view showing the periphery of the conductive fitting of the fitting-equipped conductive sheet according to the embodiment.

As shown in FIGS. 2 and 5, each conductive fitting 3 is formed as a result of a flat plate-shaped plate material having been folded back into two. The first sandwiching portion 31 and the second sandwiching portion 32 are folded back with the folded-back portion 33 disposed on the outer side L2 thereof in the longitudinal direction L as a starting point. The conductive fitting 3 is formed of a metal material. The conductive fitting 3 can be formed of a metal material having excellent conductivity and workability. The folded-back portion 33 is a portion that is bent in a curved surface shape, and forms the parting line 331 as a folding-back contour line over the entire length in the lateral direction W. The parting line 331 of the folded-back portion 33 is formed along the lateral direction W.

Attachment portions 36 for attachment to the casing 4 or the like of the control device are formed on each of the conductive fittings 3. The attachment portions 36 are formed on opposite sides, in the lateral direction W, of the second sandwiching portion 32 so as to be extended from the second sandwiching portion 32. In addition, a threaded hole 361 for allowing passage of a screw is formed in each attachment portion 36.

Bent Apex Portion 34 and Projection 35

Figure 10:
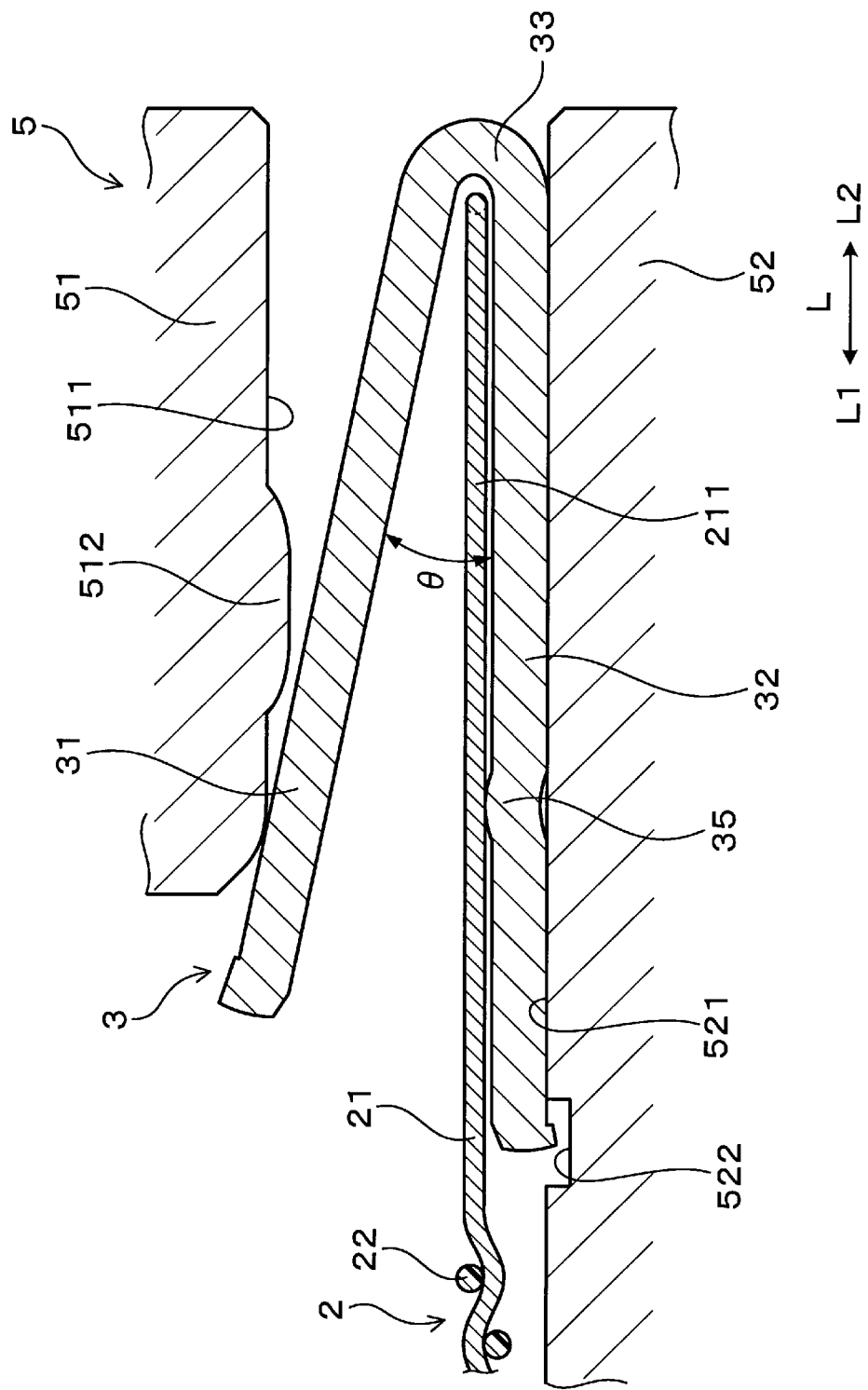
FIG. 10 is a cross-sectional view showing a state before an end of a conductive strand of the conductive sheet material is sandwiched between a first sandwiching portion and the second sandwiching portion, using a mold, according to the embodiment.

As shown in FIGS. 2 and 5, the bent apex portion 34 is a portion formed for ensuring the conduction between the ends 211 of the plurality of conductive strands 21 and each conductive fitting 3. The bent apex portion 34 is formed as a result of a part of the first sandwiching portion 31 having been deformed by a mold (die) 5 as shown in FIG. 10. The bent apex portion 34 is formed over the entire length of the first sandwiching portion 31 in the lateral direction W. The first sandwiching portion 31 is formed in a shape that is bent with the bent apex portion 34 as a boundary. A portion of the first sandwiching portion 31 that is located on the inner side L1 relative to the bent apex portion 34 in the longitudinal direction L is inclined relative to the second sandwiching portion 32 so as to be slightly separated from the second sandwiching portion 32 as a result of spring back after working.

The bent apex portion 34 is formed bulging in a protruding shape on the inner surface 311 of the first sandwiching portion 31. The interval between the first sandwiching portion 31 and the second sandwiching portion 32 becomes smaller at the position where the bent apex portion 34 is formed.

As shown in FIGS. 2 and 5, the projection 35 is a portion formed for preventing water traveling along the conductive sheet material 2 to penetrate the conductive fitting 3 from reaching the bent apex portion 34. The projection 35 is formed on an inner surface 321 of the second sandwiching portion 32 that faces the inner surface 311 of the first sandwiching portion 31 on which the bent apex portion 34 is formed. The projection 35 is formed over the entire length of the second sandwiching portion 32 in the lateral direction W at a position located on the conductive sheet material 2 side relative to the bent apex portion 34, or in other words, at a position located on the inner side L1 relative to the bent apex portion 34 in the longitudinal direction L.

The projection 35 is formed by a part of the material of the second sandwiching portion 32 that protrudes from the inner surface 321 of the second sandwiching portion 32, along the lateral direction W, which is the direction in which the bent apex portion 34 is formed. The projection 35 is formed bulging in a protruding shape on the inner surface 321 of the second sandwiching portion 32. The projection 35 is formed by causing the material to flow from the outer surface 322 of the second sandwiching portion 32 to the inner surface 321 thereof. The interval between the first sandwiching portion 31 and the second sandwiching portion 32 becomes smaller at the position where the projection 35 is formed. The projection 35 is formed so as to be orthogonal to the ends 211 of the plurality of conductive strands 21.

As shown in FIG. 2, the projection 35 is formed so as to be opposed to a portion 310 on the distal end side of the first sandwiching portion 31 that expands in a slope shape relative to the second sandwiching portion 32. Also, the ends 211 of the plurality of conductive strands 21 are compressed by the bent apex portion 34 and the second sandwiching portion 32, and are compressed by, or brought into pressure contact with, the projection 35 and the first sandwiching portion 31. That is, the interval between the first sandwiching portion 31 and the second sandwiching portion 32 becomes the smallest at the position where the bent apex portion 34 is formed, and becomes the second smallest at the position where the projection 35 is formed.

Figure 6:
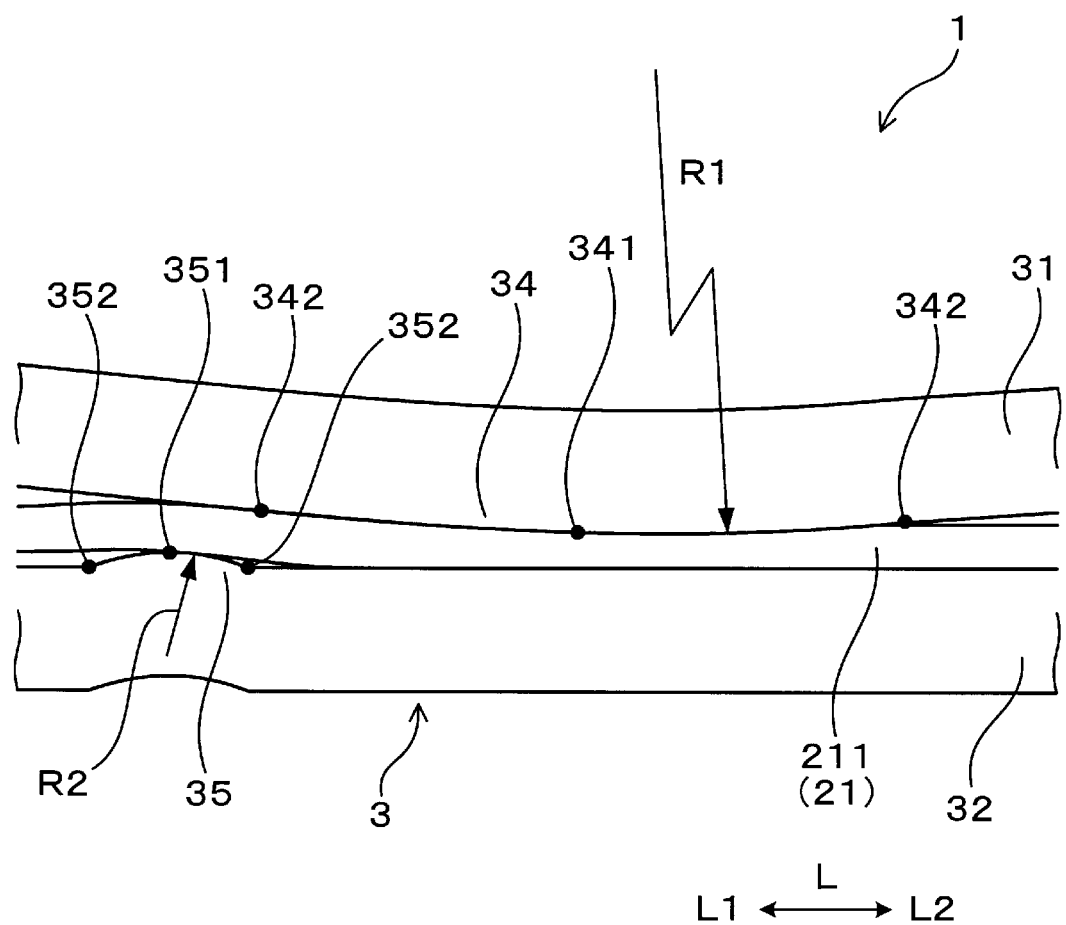
FIG. 6 is an enlarged explanatory diagram showing a part of the conductive fitting of the fitting-equipped conductive sheet according to the embodiment.

As shown in FIG. 6, the radius of curvature R1 of the bent apex portion 34 is larger than the radius of curvature R2 of the projection 35, and it is thus possible to prevent the bent apex portion 34 from compressing (crushing) more than necessary the ends 211 of the plurality of conductive strands 21 when the ends 211 of the plurality of conductive strands 21 are sandwiched between the bent apex portion 34 and the second sandwiching portion 32. The bent apex portion 34 is a part of the first sandwiching portion 31 that has been firmly pressed and deformed by a protrusion 512 of a first mold 45 portion 51, which will be described later.

On the other hand, the radius of curvature R2 of the projection 35 is smaller than the radius of curvature R1 of the bent apex portion 34, and it is thus possible to effectively prevent water from penetrating the bent apex portion 34 from the ends 211 of the plurality of conductive strands 21. Note that the hatching is omitted in FIG. 6.

The bent apex portion 34 can be formed as an apex portion of a protrusion having a curved surface shape. Alternatively, the bent apex portion 34 can be formed as a flat apex portion of a protrusion having a trapezoidal shape. The radius of curvature R1 of the bent apex portion 34 can be a radius of curvature R1 of a virtual curve passing through an apex 341 of the bent apex portion 34 and one of bending boundary portions (bending start points) 342. If two different radii of curvature R1 can be obtained, the smaller radius of curvature R1 can be used.

Figure 7:
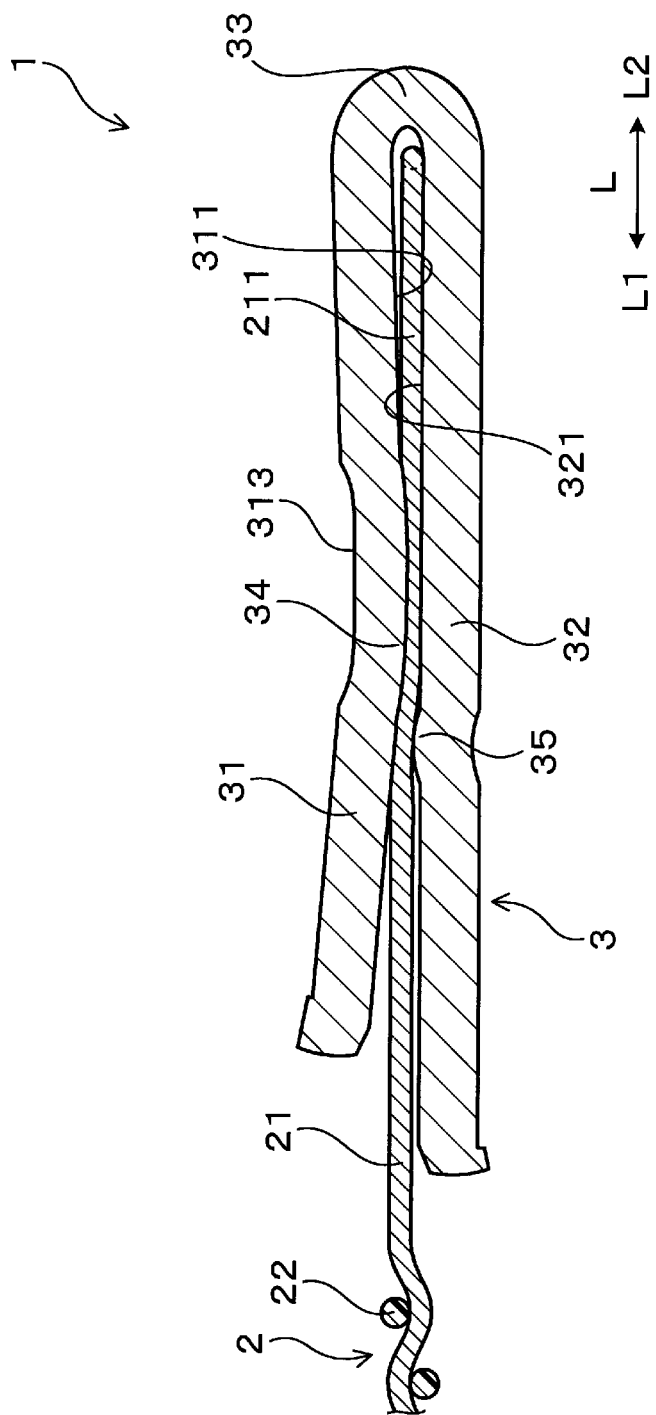
FIG. 7 is a cross-sectional view showing the periphery of the conductive fitting of the fitting-equipped conductive sheet according to the embodiment.

As shown in FIG. 7, a recessed mark 313 that is recessed by a protrusion 512 of a first mold portion 51, which will be described later, may be formed in the outer surface 312 of the first sandwiching portion 31 on which the bent apex portion 34 is formed. In this case, a shape similar to the shape of the recessed mark 313 may be reflected on the shape of the bent apex portion 34 protruding from the inner surface 311 of the first sandwiching portion 31.

As shown in FIG. 6, the projection 35 can be formed in a shape in which the flat inner surface 321 of the second sandwiching portion 32 abruptly changes in shape. This shape can be easily formed since the radius of curvature R2 of the projection 35 is smaller than the radius of curvature R1 of the bent apex portion 34. The projection 35 can be formed as a protrusion having a curved surface shape. The radius of curvature R2 of the projection 35 can be a radius of curvature R2 of a virtual curve passing through an apex 351 of the projection 35 and one of bending boundary portions 352. If two different radii of curvature R2 can be obtained, the smaller radius of curvature R2 can be used.

The expression "projection 35 at a position located on the conductive sheet material 2 side relative to the bent apex portion 34" means that the apex 351 of the projection 35 is at a position located on the inner side L1 relative to the apex 341 of the bent apex portion 34 in the longitudinal direction L. Assuming that the apex 351 of the projection 35 is displaced from the apex 341 of the bent apex portion 34 in the longitudinal direction L, a part of the bent apex portion 34 and a part of the projection 35 may overlap each other in a direction in which the first sandwiching portion 31 and the second sandwiching portion 32 are opposed to each other.

In the present embodiment, the width between the bending boundary portions 352 of the projection 35 in the longitudinal direction L is smaller than the width between the bending boundary portions 342 of the bent apex portion 34 in the longitudinal direction L. Since the bent apex portion 34 is a portion for ensuring electrical conduction, the width of the bent apex portion 34 in the longitudinal direction L needs to be relatively large. In contrast, the projection 35 is a part for preventing entry of water in the bent apex portion 34, and therefore does not require a width in the longitudinal direction L that is required for the bent apex portion 34.

In FIGS. 2 and 7, the end 211 of the conductive strand 21 is described as being slightly separated from the second sandwiching portion 32 at a position located on the inner side L1 relative to the projection 35 in the longitudinal direction L. A configuration may also be adopted in which the end 211 of the conductive strand 21 is in close contact with the second sandwiching portion 32 on the inner side L1 relative to the projection 35 in the longitudinal direction L.

Figure 8:
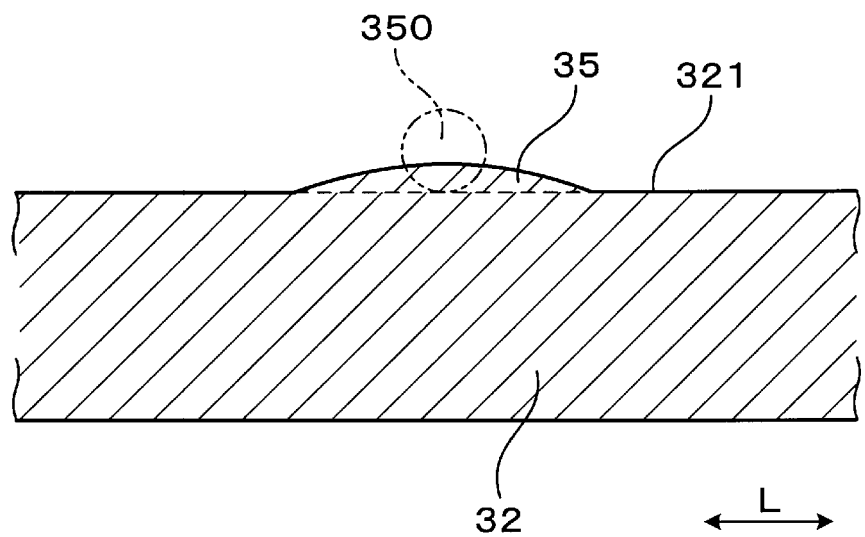
FIG. 8 is a cross-sectional view showing the periphery of a projection of a second sandwiching portion of the conductive fitting according to the embodiment.

As shown in FIG. 8, the projection 35 can also be formed by a metal material serving as an addition material provided on the inner surface 321 of the second sandwiching portion 32, along the lateral direction W, which is the direction in which the bent apex portion 34 is formed (see FIG. 5). This metal material can be a soldering metal material, for example. In this case, the metal material can be attached to the inner surface 321 of the second sandwiching portion 32.

Also, in this case, a solder wire 350 obtained by forming a soldering metal material in the form of a round wire can be used, and the solder wire 350 can be melted and attached to the inner surface 321 of the second sandwiching portion 32. Then, the metal material of the solder wire 350 attached to the inner surface 321 of the second sandwiching portion 32 constitutes the projection 35.

Figure 9:
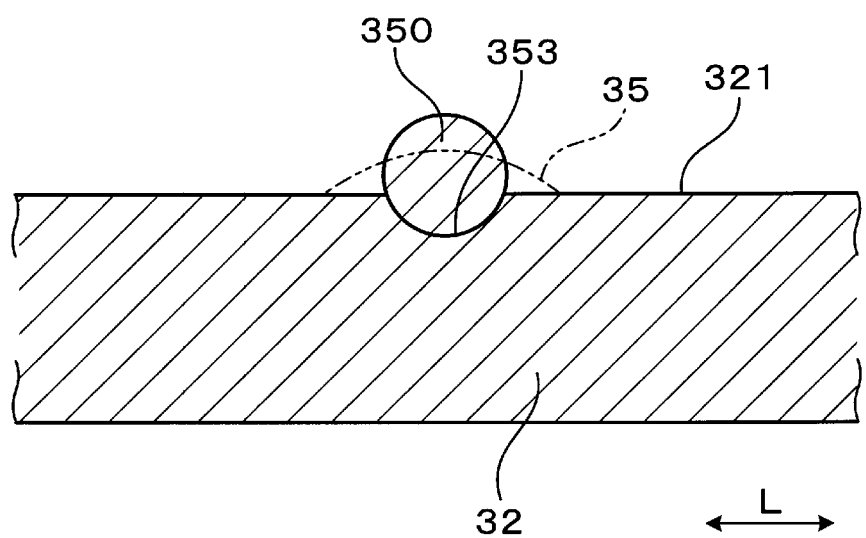
FIG. 9 is a cross-sectional view showing the periphery of another projection of the second sandwiching portion of the conductive fitting according to the embodiment.

As shown in FIG. 9, a groove 353 for placing the solder wire 350 can be formed in the second sandwiching portion 32 at a position where the solder wire 350 is to be placed. The groove 353 is formed along the parting line 331 of the folded-back portion 33 and the lateral direction W. Then, in a state in which the solder wire 350 is placed in the groove 353, the solder wire 350 can be melted, and a part thereof that protrudes from the groove 353 to the inner surface 321 of the second sandwiching portion 32 can form the projection 35.

The addition material to be attached to the inner surface 321 of the second sandwiching portion 32 can be a resin material that forms an adhesive. This resin material can be formed of a curable resin. In this case as well, the groove 353 can be formed in the inner surface 321 of the second sandwiching portion 32, and the resin material can be disposed along the groove 353.

Mold 5

As shown in FIG. 10, when sandwiching the conductive sheet material 2 between the first sandwiching portion 31 and the second sandwiching portion 32, a mold 5 is used that includes a first mold portion 51 and a second mold portion 52 that are opposed to each other. The first mold portion 51 and the second mold portion 52 are configured to move toward each other so as to further fold the first sandwiching portion 31 and the second sandwiching portion 32 of the conductive fitting 3 before working. The conductive fitting 3 before working is formed in a state in which the first sandwiching portion 31 and the second sandwiching portion 32 form an acute angle θ. This acute angle θ can be an angle of 10 to 30°, for example.

Figure 11:
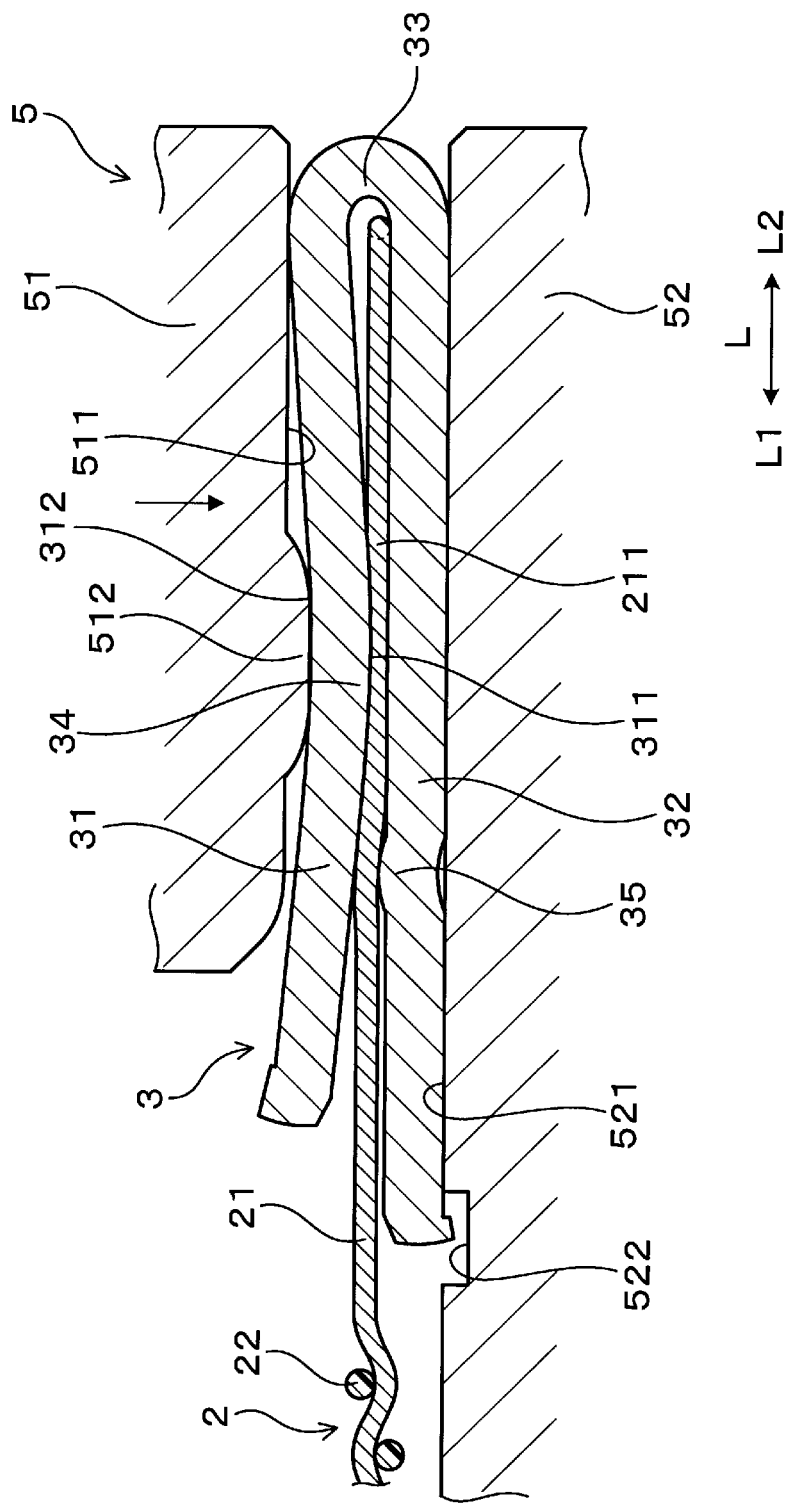
FIG. 11 is a cross-sectional view showing a state after the end of the conductive strand of the conductive sheet material is sandwiched between the first sandwiching portion and the second sandwiching portion, using the mold, according to the embodiment.

As shown in FIG. 11, the mold 5 of the present embodiment is configured to move the first mold portion 51 toward the second mold portion 52 so as to further bend (fold) the first sandwiching portion 31 by the first mold portion 51 toward the second sandwiching portion 32 disposed on the second mold portion 52.

As shown in FIGS. 10 and 11, a protrusion 512 for forming the bent apex portion 34 on the first sandwiching portion 31 is formed on a working face 511 of the first mold portion 51. The interval between the working face 511 of the first mold portion 51 and a second mold portion 52 of a working face 521 is the smallest at the position of the apex of the protrusion 512. The bent apex portion 34 is formed by being pressed most firmly by the apex of the protrusion 512, as compared with the other portions.

A portion of the working face 511 of the first mold portion 51 that is other than the protrusion 512 on a surface coming into contact with the first sandwiching portion 31 is formed flat. Also, a surface of the working face 521 of the second mold portion 52 that comes into contact with the second sandwiching portion 32 is formed flat. Note that a relief groove 522 is formed in the working face 521 of the second mold portion 52 at a position opposed to a distal end of the second sandwiching portion 32.

Mounting Method

A method for mounting the conductive sheet material 2 and the conductive fittings 3 together will be described.

A fitting-equipped conductive sheet 1 is formed by attaching conductive fittings 3 to opposite sides of a conductive sheet material 2. First, a conductive sheet material 2 including a plurality of conductive strands 21 extending along the longitudinal direction L is prepared, and a conductive fitting 3 before working including a projection 35 formed along the lateral direction W is prepared. Opposite ends 211 of each of the conductive strands 21 of the conductive sheet material 2 are not covered by the reinforcing material 22, and are exposed. In addition, the conductive fitting 3 before working is formed in a state in which the first sandwiching portion 31 and the second sandwiching portion 32 form an acute angle θ.

Then, as shown in FIG. 10, the conductive fitting 3 before working is disposed on the second mold portion 52, with the second sandwiching portion 32 located on the lower side, and the ends 211 of the plurality of conductive strands 21 of the conductive sheet material 2 are arranged between the second sandwiching portion 32 and the first sandwiching portion 31 of the conductive fitting 3. Then, as shown in FIG. 11, the first mold portion 51 is moved toward the second mold portion 52. At this time, the working face 511 of the first mold portion 51 abuts against the first sandwiching portion 31, and the first sandwiching portion 31 is further folded toward the second sandwiching portion 32, with the folded-back portion 33 as a starting point.

Then, the ends 211 of the plurality of conductive strands 21 are sandwiched between the bent apex portion 34 of the first sandwiching portion 31 and the second sandwiching portion 32. At this time, the protrusion 512 on the working face 511 of the first mold portion 51 deforms the first sandwiching portion 31. The material of a part of the first sandwiching portion 31 that comes into contact with the protrusion 512 is deformed so as to move from the outer surface 312 to the inner surface 311. Thus, the bent apex portion 34 protruding from the inner surface 311 is formed on the inner surface 311 of the first sandwiching portion 31.

As a result of formation of the bent apex portion 34, the ends 211 of the plurality of conductive strands 21 that abut against the bent apex portion 34 are crushed, and the ends 211 of the plurality of conductive strands 21 are brought into close contact with the bent apex portion 34. Consequently, an electrical connection portion for ensuring electrical connection between the conductive sheet material 2 and the conductive fitting 3 is formed.

As shown in FIG. 11, when the bent apex portion 34 is formed, the projection 35 on the inner surface 321 of the second sandwiching portion 32 is brought into pressure contact with the ends 211 of the plurality of conductive strands 21. Then, the projection 35 and the bent apex portion 34 abut against the ends 211 of the plurality of conductive strands 21 in this order from a position located on the inner side L1 in the longitudinal direction L. Thus, the conductive fitting 3 is attached to the ends 211 of the plurality of conductive strands 21 of the conductive sheet material 2.

Thereafter, when the first mold portion 51 moves away from the second mold portion 52, the portion 310 of the first sandwiching portion 31 that is located on the distal end side relative to the bent apex portion 34 slightly springs back in a direction away from the second sandwiching portion 32. After this spring back, the first sandwiching portion 31 has a shape that is bent with the bent apex portion 34 as a starting point. Even after the spring back, the state in which the bent apex portion 34 is in contact with the ends 211 of the plurality of conductive strands 21 and the state in which the projection 35 is in contact with the ends 211 of the plurality of conductive strands 21 are maintained.

Note that the conductive fitting 3 can also be attached to the other ends 211 of the plurality of conductive strands 21 of the conductive sheet material 2 through the above-described working.

Operation and Effects

In the fitting-equipped conductive sheet 1 according to the present embodiment, the bent apex portion 34 is formed on the inner surface 311 of the first sandwiching portion 31 of the conductive fitting 3, and the conductive sheet material 2 is electrically connected to the conductive fitting 3 by the bent apex portion 34. The bent apex portion 34 is formed as a result of the first sandwiching portion 31 having been bent, and the electrical connection between the conductive sheet material 2 and the conductive fitting 3 can be ensured by the bent apex portion 34.

The ends 211 of all the conductive strands 21 of the conductive sheet material 2 that extend in the longitudinal direction L are brought into pressure contact with the bent apex portion 34. Also, the ends 211 of all the conductive strands 21 extending in the longitudinal direction L are sandwiched between the bent apex portion 34 of the first sandwiching portion 31 and the second sandwiching portion 32 so as to be orthogonal to the bent apex portion 34. That is, between the bent apex portion 34 and the second sandwiching portion 32, the ends 211 of the plurality of conductive strands 21 that are orthogonal to the bent apex portion 34 and extend in the longitudinal direction L are present, and no conductive strand 21 that is substantially parallel to the direction in which the bent apex portion 34 is formed is present. Accordingly, it is possible to reduce the occurrence of variation in the state in which the ends 211 of the plurality of conductive strands 21 of the conductive sheet material 2 are sandwiched by the conductive fitting 3.

No conductive strand that is substantially parallel to the lateral direction W, which is the direction in which the bent apex portion 34 is formed, is present between the bent apex portion 34 and the second sandwiching portion 32. Accordingly, if the fitting-equipped conductive sheet 1 is wetted, water may enter the bent apex portion 34 for ensuring electrical connection between the conductive sheet material 2 and the conductive fitting 3. To deal with this problem, in the fitting-equipped conductive sheet 1 according to the present embodiment, the projection 35 is formed on the inner surface 321 of the second sandwiching portion 32 at a position located on the conductive sheet material 2 side (the inner side L1 in the longitudinal direction L) relative to the bent apex portion 34.

The radius of curvature R2 of the projection 35 is formed to be smaller than the radius of curvature R1 of the bent apex portion 34, and the projection 35 is in contact with the ends 211 of all the conductive strands 21 extending in the longitudinal direction L. Accordingly, water traveling along the plurality of conductive strands 21 of the conductive sheet material 2 to enter the bent apex portion 34 can be blocked by the projection 35. Also, it is possible to prevent formation of rust or the like in a portion where the conductive sheet material 2 and the conductive fitting 3 are electrically connected to each other, thus maintaining the electrical connection between the conductive sheet material 2 and the conductive fitting 3.

With the fitting-equipped conductive sheet 1 according to the present embodiment, it is possible to reduce the occurrence of variation in the state in which the conductive sheet material 2 is sandwiched by the conductive fitting 3, and prevent entry of water in the bent apex portion 34 serving as a portion where the conductive sheet material 2 and the conductive fitting 3 are electrically connected to each other.

The present disclosure is not limited to only the embodiments, and further different embodiments can be made without departing from the gist of the disclosure. Furthermore, the present disclosure includes various modifications, modifications within the scope of equivalency thereof, and so forth.

The invention claimed is:

1. A fitting-equipped conductive sheet comprising:
   a conductive sheet material in which a plurality of conductive strands are aligned planarly; and
   a plate-shaped conductive fitting attached to ends of the plurality of conductive strands,
   wherein the conductive fitting includes a folded-back portion, and a first sandwiching portion and a second sandwiching portion that are folded back with the folded-back portion as a starting point and the first sandwiching portion and the second sandwiching portion are opposed to each other,
   a bent apex resulting from the first sandwiching portion having been bent toward the second sandwiching portion is formed on an inner surface of the first sandwiching portion so as to be parallel to a parting line of the folded-back portion,
   the ends of the plurality of conductive strands are electrically connected to the conductive fitting by being brought into pressure contact with the bent apex and sandwiched between the bent apex and the second sandwiching portion so as to intersect the bent apex, and
   a projection having a smaller radius of curvature than the bent apex is formed on an inner surface of the first sandwiching portion or the second sandwiching portion at a position located on the conductive sheet material side relative to the bent apex so as to be in contact with the ends of the plurality of the conductive strands.

2. The fitting-equipped conductive sheet according to claim 1,
   wherein the plurality of conductive strands are aligned along a direction perpendicular to a direction in which the bent apex is formed, and
   portions of the plurality of conductive strands that are other than the ends are maintained in a state in which a predetermined interval is maintained therebetween by an insulating reinforcing material.

3. The fitting-equipped conductive sheet according to claim 2,
   wherein the reinforcing material includes linear portions that intersect the plurality of conductive strands, and
   the plurality of conductive strands are braided by the linear portions.

4. The fitting-equipped conductive sheet according to claim 1,
   wherein the projection is formed by a part of a material of the conductive fitting that protrudes from the inner surface along a direction in which the bent apex is formed.

5. The fitting-equipped conductive sheet according to claim 1,
   wherein the projection is a formed by an addition material integrated in one piece with the inner surface along a direction in which the bent apex is formed.

6. The fitting-equipped conductive sheet according to claim 1,
   wherein the projection is formed on the inner surface of the second sandwiching portion.

7. The fitting-equipped conductive sheet according to claim 1,
   wherein the conductive fitting is attached to opposite ends of the plurality of conductive strands, and includes an attachment for externally attaching the conductive fitting, and
   the fitting-equipped conductive sheet is used as an electromagnetic shielding material that covers an electromagnetic noise source with the conductive sheet material.

* * * * *